United States Patent [19]
Miyashita et al.

[11] Patent Number: 5,555,798
[45] Date of Patent: Sep. 17, 1996

[54] HOT PRESS FOR PRODUCING A MULTILAYERED SUBSTRATE

[75] Inventors: Akimi Miyashita, Toride; Mutsumasa Fujii, Ibaraki-ken; Kenji Hisadomi, Tsuchiura, all of Japan

[73] Assignee: Hitachi Techno Engineering Co., Ltd., Tokyo, Japan

[21] Appl. No.: 149,616

[22] Filed: Nov. 9, 1993

[30] Foreign Application Priority Data

Nov. 9, 1992 [JP] Japan ..................... 4-298536

[51] Int. Cl.⁶ .................................. B30B 15/34
[52] U.S. Cl. ................ 100/93 P; 100/218; 100/264; 156/583.1
[58] Field of Search .................... 100/93 P, 218, 100/264; 156/228, 581, 583.1

[56] References Cited

U.S. PATENT DOCUMENTS

| | | | |
|---|---|---|---|
| 2,108,920 | 2/1938 | Humiston | 100/93 P |
| 2,300,339 | 10/1942 | Camerota | 100/93 P |
| 2,404,165 | 7/1946 | Carver | 100/93 P |
| 3,361,608 | 1/1968 | Janetos et al. | 100/93 P |
| 4,304,178 | 12/1981 | Häberle | 100/93 P |
| 4,310,376 | 1/1982 | Ebina et al. | 156/581 |
| 4,443,288 | 4/1984 | Sawada et al. | 156/583.1 |
| 5,297,480 | 3/1994 | Miyashita et al. | 100/93 P |

FOREIGN PATENT DOCUMENTS

| | | | |
|---|---|---|---|
| 2447788 | 10/1980 | France | 100/93 P |
| 1403706 | 3/1969 | Germany | 100/93 P |
| 62-119025 | 5/1987 | Japan | 156/583.1 |
| 1-253426 | 10/1989 | Japan | 156/583.1 |

*Primary Examiner*—Stephen F. Gerrity
*Attorney, Agent, or Firm*—Antonelli, Terry, Stout & Kraus

[57] ABSTRACT

A hot press for producing multilayered substrate blanks wherein the substrate blanks are placed between upper and lower bolsters via heat insulating plates and heating plates. The multilayered substrate blanks are fitted into a frame which is provided on the upper bolster and the multilayered substrate blanks are pressed and heated. The frame is fashioned of a material having a coefficient of thermal expansion less than the coefficients of thermal expansion of the multilayered substrate blanks. When the multilayered substrate blanks are pressed and heated, outside dimensions become equal to the inside dimensions of the frame. Thus, no flow of an adhesive out of the multilayered substrate blanks occurs, and as a result it is possible to produce a high density multilayered substrate with a large number of layers.

4 Claims, 7 Drawing Sheets

HOT PRESS FOR PRODUCING A MULTILAYERED SUBSTRATE

BACKGROUND OF THE INVENTION

1. Field of the Invention

The present invention relates to a hot press for producing a multilayered substrate such as a multilayered ceramic substrate, in particular, to a hot press suitable for forming a high performance and high surface pressure ceramic substrate and the like.

2. Description of the Related Art

Due to an increase in the density and the number of layers of a multilayered ceramic substrate formed by a hot press, a higher performance hot press has been required for producing such a multilayered ceramic substrate, which can handle the variations in outside dimensions of the multilayered ceramic blanks and which reduces superposition errors between one layer and another layer.

One conventional technique to achieve the requirements described above is disclosed in Japanese Patent Application Laid-Open No. 59-114894, in which a substrate blank is vacuum-packed and then forming is effected by heat and hydrostatic pressure.

However, processing under hydrostatic pressure results in poor productivity. To avoid this problem, there is a technique in which a frame fixture of high rigidity metal is provided on a heating plate of a hot press wherein the frame fixture has dimensions larger than the outside dimensions of substrate blanks to be formed by several ten microns, and substrate blanks are put in the metal frame fixture so as to perform forming by pressing and heating them between the fixture and an upper heat plate.

When blanks are pressed in the vertical direction to form a multilayered substrate, because only atmospheric pressure is applied to a periphery of the blanks, some of blanks at the periphery are put out due to the difference in pressure between the outside and the inside. As a result, the density is lower at a peripheral region than at a central portion of the substrate.

In the above-mentioned conventional technique using a metal frame fixture, a rather large space is required between the fixture and substrate blanks to improve productivity. Thus, it is impossible to prevent the substrate blanks from being put out.

SUMMARY OF THE INVENTION

It is an object of the present invention to provide a hot press for easily producing a multilayered substrate with high density and with a large number of layers without putting out blanks for the substrate.

It is another object of the present invention to provide a hot press whereby it is possible to easily make initial fitting of a fixture plate to a frame and it is also possible to easily remove the fixture plate from the frame.

It is another object of the present invention to provide a hot press whereby it is possible to mechanically remove a residual adhesive remaining on the inner surface of a frame.

To achieve the objects described above, in one aspect of the present invention, a hot press for producing a multilayered substrate comprises upper and lower bolsters which are arranged to vertically oppose to each other and movable relative to and toward each other, with upper and lower heat plates being provided on the opposed surfaces of the upper and lower bolsters through heat insulating plates, respectively. A moving means moves at least one of the upper and lower bolsters with respect to the other and a temperature control system including heating and cooling means and cool the upper and lower heat plates, whereby substrate blanks consisting of a plurality of substrates superimposed one on another via an adhesive are positioned and put between the upper and lower heating plates and then these substrate blanks are pressed and heated by the moving means and by heating means and finally the substrate blanks are cooled by cooling means. The hot press includes a frame provided on one of the upper and lower heating means, with the substrate blanks being fitted in the frame, and with the substrate blanks limiting the expansion of the substrate blanks when the substrate blanks are pressed and heated by the upper and lower heating plates.

To achieve the objects described above, in another aspect of the present invention, the frame is made of a material having a thermal expansion coefficient less than both of thermal expansion coefficients of the multilayered substrate blanks and the thermal expansion coefficient of the fixture plate which is inserted between the upper and lower heating plates together with the superimposed substrate blanks, and furthermore the frame is connected to a temperature control system which is provided separately from the temperature control system connected to the upper and lower heating plates.

To achieve the objects described above, in still another aspect of the present invention, a cleaning plate is provided inside the frame, with the cleaning plate having outside dimensions slightly larger than the inside dimensions of the frame, the cleaning plated is fixed to an operating means for performing the sliding operation of the cleaning plate.

In the present invention, when the fixture plate with substrate blanks consisting of a plurality of ceramic substrates and the like superimposed one on another via an adhesive is put between the upper and lower heating plates so as to press and heat it, sticking out of the substrate blanks is limited by the frame. Thus, it is possible to easily produce a high density ceramic substrate and the like having a large number of layers with no sticking out of the substrate blanks.

Furthermore, in the present invention, the frame is made of a material having a thermal expansion coefficient less than both of the thermal coefficients of the substrate blanks and the fixture plate. Thus, it becomes possible to easily remove the fixture plate from the frame after completion of forming.

Each portion of a frame and a fixture plate should be arranged such that the space gn is maintained between the frame and a fixture plate during a forming process wherein the space is given by the following equations:

$$gn = Lo\{1+\alpha o(tn-t_1)\} - Li\{1+\alpha i(tn+ti)\} \qquad (1)$$

$$gn \geq 0 \qquad (2)$$

where Lo is the inside dimension of the frame (at room temperature), Li is the outside dimension of the fixture plate (at room temperature), $\alpha o$ is the thermal expansion coefficient of the frame member, $\alpha i$ is the thermal expansion coefficient of the fixture plate, tn is forming temperature, and $t_1$ is separation temperature (room temperature).

At room temperature, if the inside dimension Lo of a frame at room temperature and the outside dimension Li of a fixture plate are given, then the space $g_1$ between the frame and the fixture plate is determined the following equation by:

$$g_1 = Lo - Li \qquad (3)$$

From these equations, it can be seen that a higher forming temperature results in a larger space $g_1$ at room temperature, which results in easier separation between the frame and the fixture plate.

When the fixture plate is inserted into the frame, the outer portions of substrate blanks and fixture plate come into contact with the frame, which possibly disturbs the forming temperature of the substrate. To avoid this problem, in the present invention, the frame is connected to a thermal control system which is different from that associated with the upper and lower heat plates so that the temperature of the frame can be controlled independently of the control of the upper and lower heat plates. As a results, it becomes possible to prevent the forming temperature of the substrate from being disturbed by contact between the frame and the outside portion of the substrate blanks and the fixture plate. Thus, it becomes possible to heat the substrate blanks more uniformly. Furthermore, it is ensured that the initial fitting of the fixture plate into the frame can be more easily performed, and the fixture plate and a produced multilayered substrate can be more easily separated from the frame.

Furthermore, in the present invention, a cleaning plate is disposed inside the frame such that the cleaning plate is attached to an operating means for performing sliding operation. During a forming process, the cleaning plate heats and presses the fixture plate through the heating plate and bolster lying on the side for applying pressure. After completion of heating and pressing, the fixture plate is removed from the frame by using the operating means and then the operating means is slid forward and backward so as to remove a residual adhesive remaining on the internal surface of the frame. In this manner, the fixture plate can be heated more uniformly and pressed with more uniform pressure. Furthermore, it is secured that the fixture plate can be easily removed from the frame. It is also possible to achieve thorough cleaning by mechanically removing a residual adhesive remaining on the internal surface of the frame.

DESCRIPTION OF THE PREFERRED EMBODIMENT

The hot press for producing a multilayered ceramic substrate in the embodiment of FIGS. 1–7 includes a base frame 2 on a floor 1 and a base plate 2a fixed on a top of the base frame 2.

Figure 1:
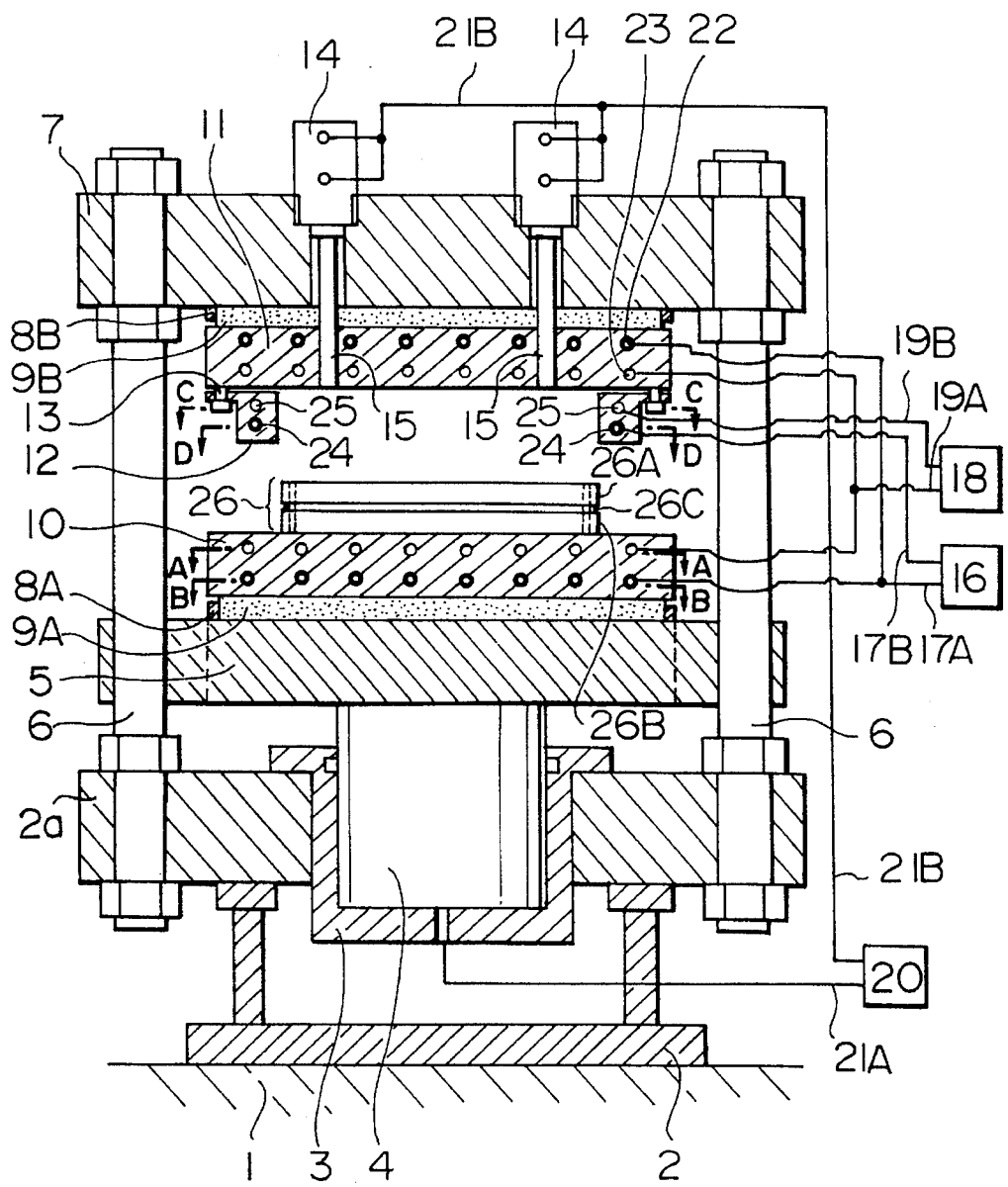
FIG. 1 is a longitudinal sectional view of a hot press for producing a multilayered ceramic substrate in accordance with one embodiment of the present invention.

A hydraulic cylinder 3 and a plurality of posts 6 are fixed to the base plate 2a as shown in FIG. 1.

A main ram 4 fitted in the hydraulic cylinder 3. The hydraulic cylinder 3 is connected to a hydraulic pressure source 20 via hydraulic piping 21B.

Lower and upper bolsters 5 and 7 are fixed to the posts 6 so as to oppose to each other. The lower bolster 5 is disposed on the main ram 4 in such a manner that the lower bolster 5 may be moved up and down, guided by the posts 6. The upper bolster 7 is disposed opposite the lower bolster 5 and is fixed to the upper portions of the posts 6, A lower heating plate 10 with a rectangular shape is mounted on the upper surface of the lower bolster 5 via a heat insulating plate 9A surrounded by a lower frame plate 8A. An upper heating plate 11 with a rectangular shape is fixed to the lower surface of the upper bolster 7 via a heat insulating plate 9B surrounded by an upper frame plate 8B, in which the upper surface of the lower bolster and the lower surface of the upper bolster form the opposed surfaces of the bolsters. As shown in FIG. 1, the Upper bolster 7 is provided with a plurality of fixture-pushdown cylinders 14 each of which is connected to the hydraulic pressure source 20 via the hydraulic piping 21B. Furthermore, a ram 15 is fitted in each of fixture-pushdown cylinders 14 such that each ram 15 extends downward through the upper heating plate 11.

Figure 2:
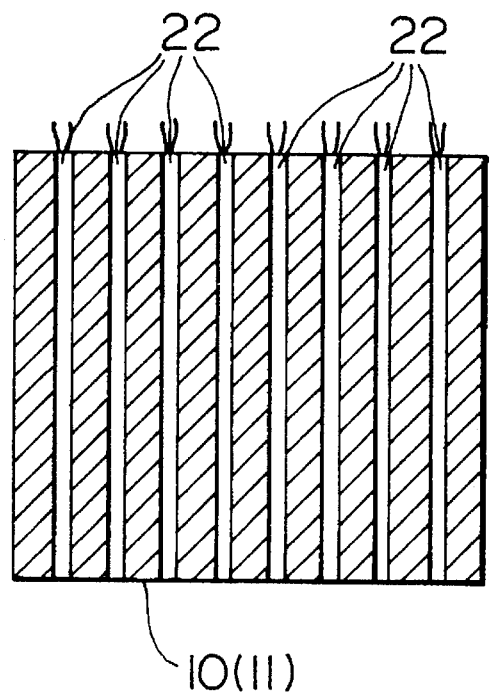
FIG. 2 is a transverse sectional view of a heating plate taken along the cutting-plane line A—A of the hot press of FIG. 1.
Figure 3:
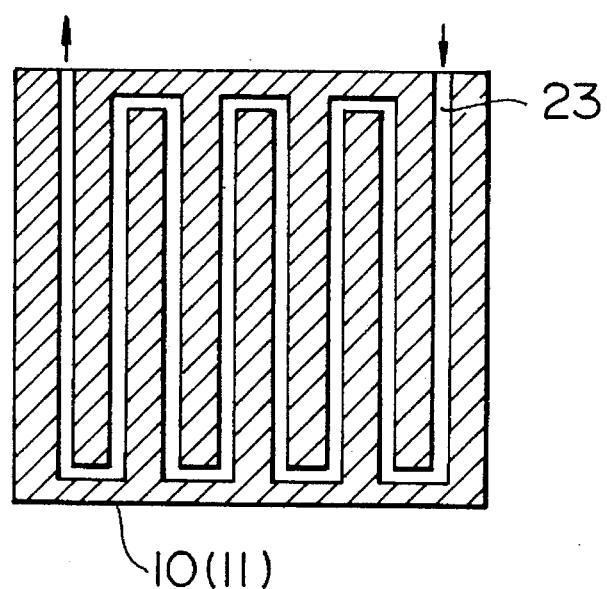
FIG. 3 is a transverse sectional view of the heating plate taken along the cutting-plane line B—B of the hot press of FIG. 1.

As shown in FIGS. 1–3, in a predetermined space, a plurality, heaters 22 for example, electric heaters and cooling medium path 23 are provided inside the lower and upper heating plates 10 and 11. Each of heaters 22 is connected to a heating power source 16 via an electric wire or a heating hose 17A. The cooling medium path 23 is formed in a zigzag shape as shown in FIG. 3. The cooling medium path 23 is connected to a cooling source 18 via a cooling hose 19A.

A fixture plate 26 shown in FIG. 1 is positioned on the upper surface of the lower heating plate 10 by a loader (not shown) or the like. As can be seen from FIG. 1, the fixture plate 26 includes an upper fixture plate 26A, a lower fixture plate 26B, and substrate blanks consisting of a plurality of ceramic substrates 26C stacked one on another via an adhesive wherein the substrate blanks are disposed between the upper and lower fixture plates 26A and 26B. The fixture plate 26 has a general form of a flat rectangle with outside bevels or outside chamfers 26a on its upper portions as shown in FIG. 6.

Figure 5:
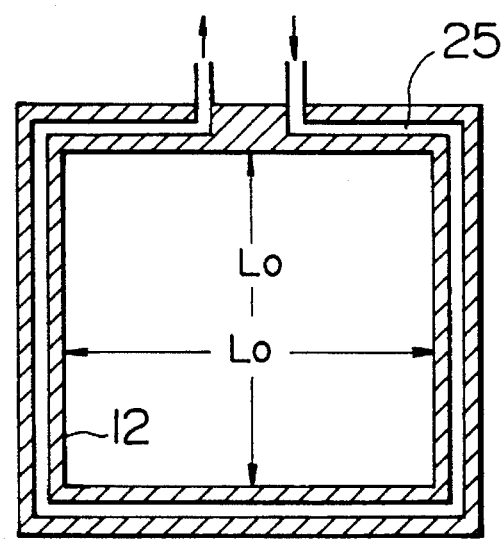
FIG. 5 is a transverse sectional view of the frame taken along the cutting-plane line D—D of the hot press of FIG. 1.
Figure 6:
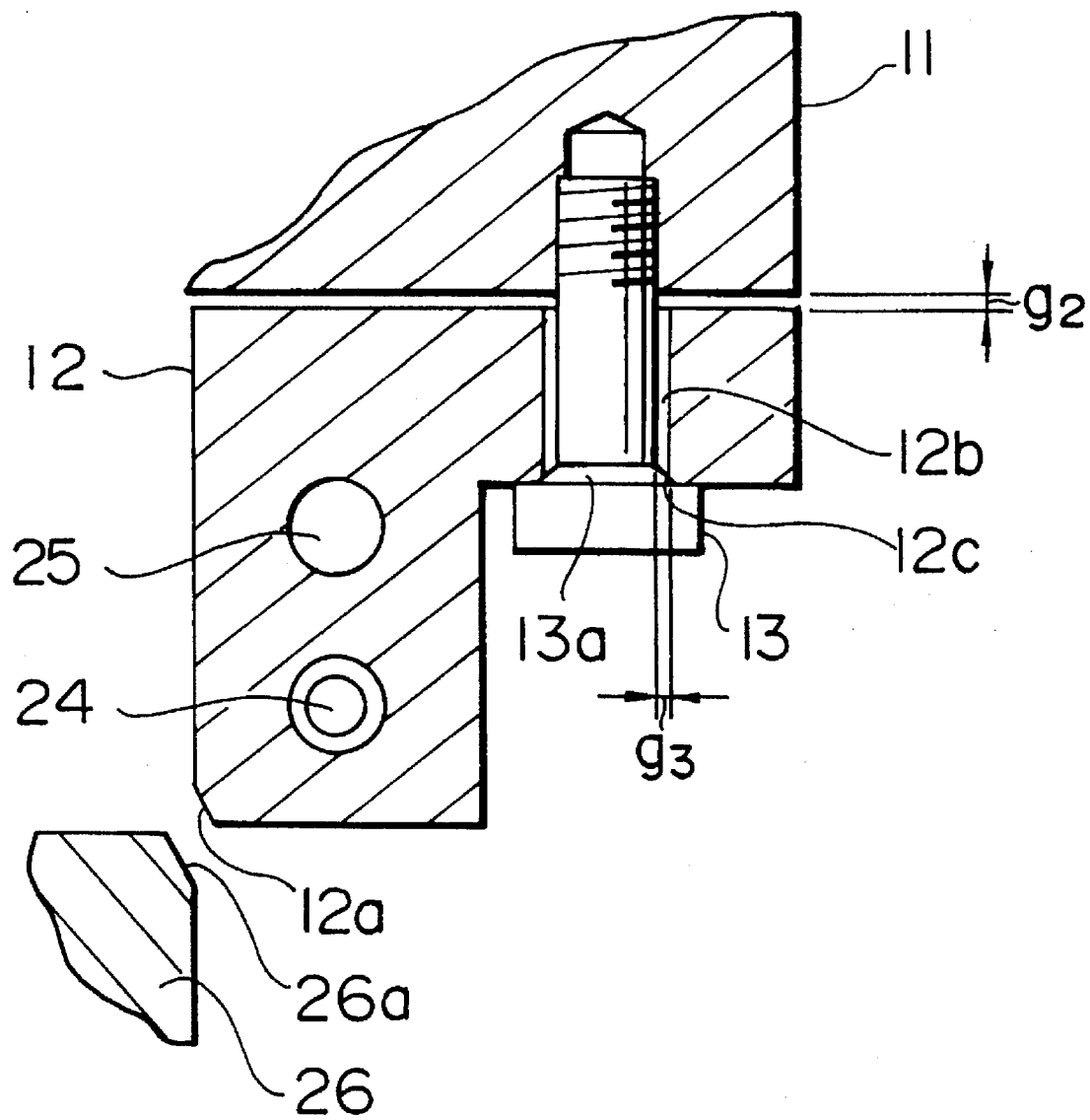
FIG. 6 is a partially enlarged longitudinal sectional view of the hat press of FIG. 1, showing a part of the frame in a state where a fixture plate with stacked substrate blanks is located near the frame.

As shown in FIGS. 1 and 6, a frame 12 is fixed to and is suspended from the upper heating plate 11 with positioning pins 13. The frame 12 is formed in a rectangular shape having an inside dimension Lo (FIG. 5) which is slightly larger at room temperature than the outside dimension Li of the fixture plate 26, wherein the frame 12 is made of a material having a thermal expansion coefficient less than that of either substrate blanks or the fixture plate 26. More specifically, the frame 12 is formed in such a manner that these dimensions satisfy equations (1)–(3). Furthermore, in a state where the frame 12 is suspended from the upper heating plate 11 with the positioning pins 13, a female tapered surface 12c of the lower portion of pin holes 12b formed in the frame 12 is in contact with a male tapered surface 12a formed near the boundary between the head and the shank of the positioning pins 13 so as to perform centering, as shown in FIG. 6. In this situation where the frame 12 is suspended from the upper heating plate 11 with the positioning pins 13, there is provided a gap $g_2$ between the lower surface of the upper heating plate 11 and the upper surface of the frame 12, and there is also provided a gap $g_3$ between the pin holes 12b and the shank of the positioning pins 13 as shown in FIG. 6. Corresponding to the outside chamfers of the fixture plate 26, there are provided inside chamfers on the lower side of the frame 12 as shown in FIG. 6. Prior to heating and pressing processes performed through the fixture plate 26, the frame 12 is fitted to the outside of the fixture plate 26 so that the expansion of the substrate blanks is limited during heating and pressing processes.

Figure 4:
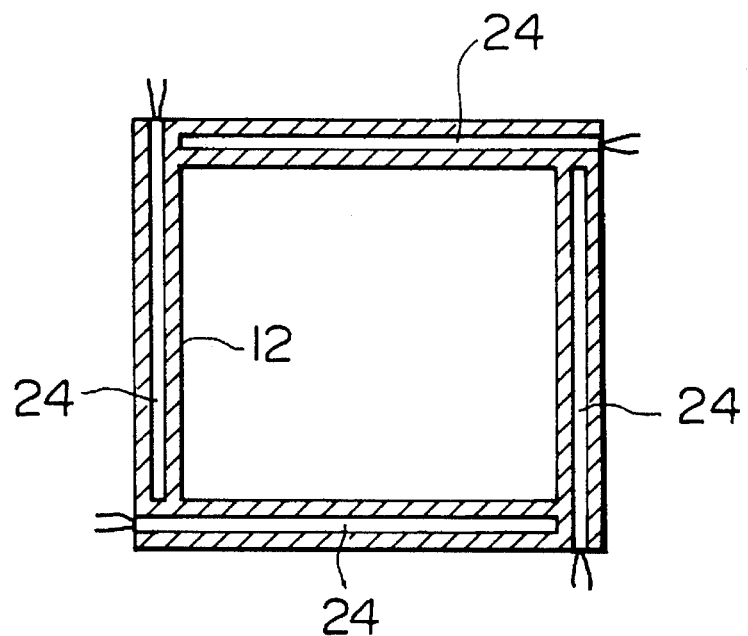
FIG. 4 is a transverse sectional view of a frame taken along the cutting-plane line C—C of the hot press of FIG. 1.

In the inside of the frame 12, there are provided heaters 24 and a cooling medium path 25 as shown in FIG. 1 and FIGS. 4–6. The heaters 24 are preferably electric heaters as in the case of the heaters 22 for the lower and upper heating plates 10 and 11. These heaters 24 are disposed in each of areas near four sides of the frame 12 having a rectangular shape as shown in FIG. 4. In this embodiment, each of heaters 24 is connected via a wire or heating hose 17 to the same heating power source 16 as one which is connected to the heaters 22, as shown in FIG. 1. As shown in FIG. 5, the cooling medium path is formed along the four sides of the rectangular frame 12. In this embodiment, the cooling medium path 25 is connected via a cooling hose 19B to the same cooling source 18 as one connected to the cooling medium path 23 as shown in FIG. 1.

In the initial state, the main ram 4 lies at the lowest position and accordingly the lower bolster 5, the heat insulating plate 9A, and the lower heating plate 10 are all at their lowest positions, as shown in FIG. 1.

In this situation, the fixture plate 26 is put in position on the upper surface of the lower heating plate 10 as shown in FIG. 1. This fixture plate 26 is composed the upper fixture plate 26A, the lower fixture plate 26B, and the substrate blanks consisting of a plurality of ceramic substrates 26C stacked one on another via an adhesive wherein the substrate blanks are fixed between the upper and lower fixture plates 26A and 26B.

After the fixture plate 26 is put in position on the upper surface of the lower heating plate 10, pressure oil is supplied to the hydraulic cylinder 3 from the hydraulic pressure source 20 via the hydraulic piping 21A raise the main ram 4 and thus so as to raise the lower bolster 5, the heat insulating plate 9A, and the lower heating plate 10, along the posts 6.

Figure 7:
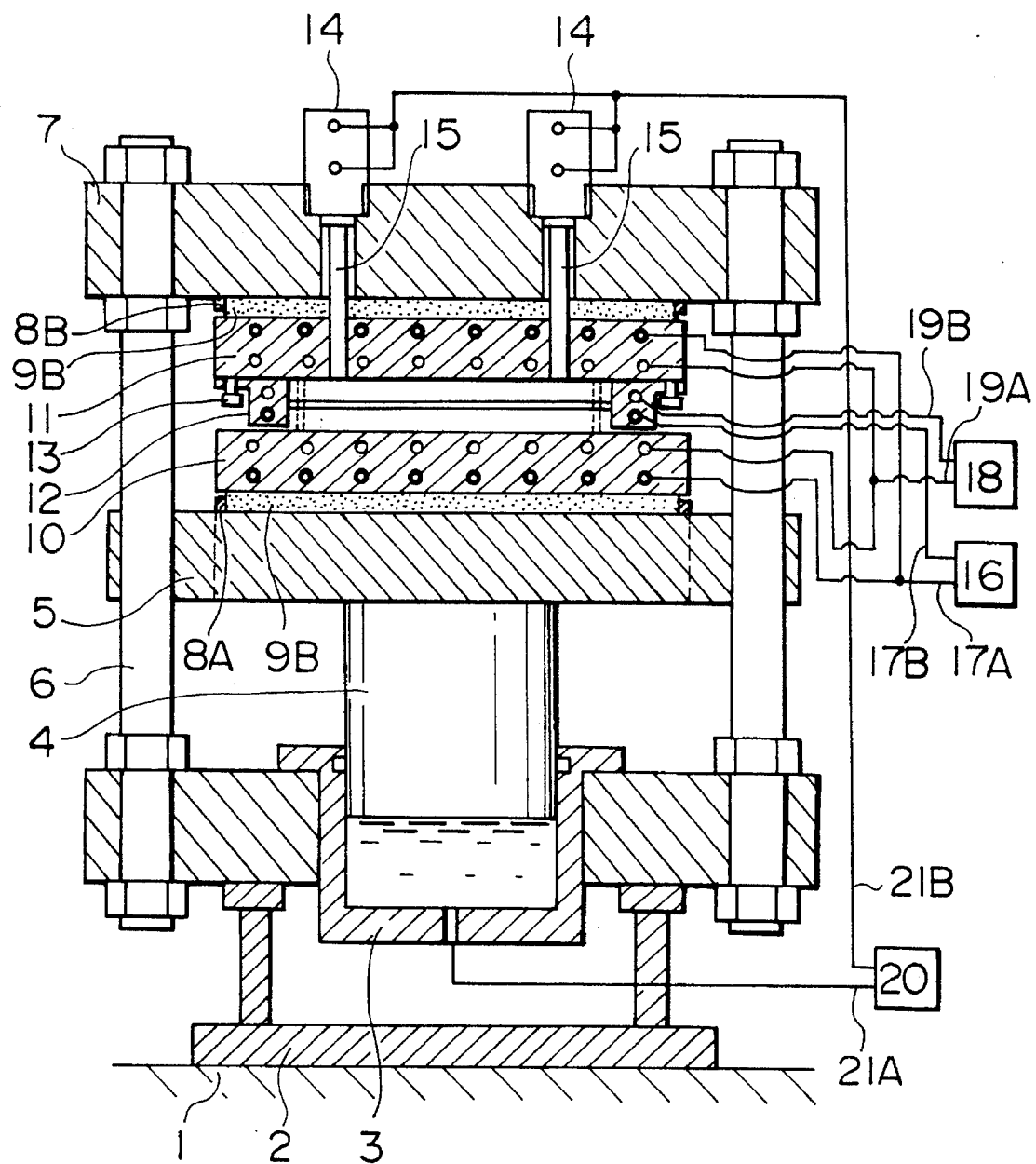
FIG. 7 is a longitudinal sectional view of the hot press of FIG. 1 which is in operation.

In this raising process, the fixture plate 26 approaches the frame 12 suspended and held from the lower portion of the upper heating plate 11 with the positioning pins 13. When the outside chamfers 26a come into contact with the inside chamfers 12a of the frame 12, the frame 12 is raised within the range of the gap $g_2$ between the lower surface of the upper heating plate 11 and the upper surface of the frame 12. As a result, the female tapered surfaces 12c of the pin holes 12b of the frame 12 come off the male tapered surface 12a of the positioning pins 13, and the frame 12 moves within the range of the gap $g^3$ between the pin holes 12b and the shanks of the positioning pins 13. This results in absorption of the errors of the substrate blanks and the fixture plate 26 introduced during the production or during positioning process. Thus, the frame 12 is fitted to the outside of the fixture plate 26. In this stage, the ram 15, fitted in the fixture-pushdown cylinders 14, is set such that its surface is in the same plane as that of the lower surface of the upper heating plate 11. When the main ram 4 is further raised, the fixture plate 26 is pressed to the lower surface of the upper heating plate 11 and thus the substrate blanks and the fixture plate 26 are pressed at a predetermined pressure by the lower and upper heating plates 10 and 11, as shown in FIG. 7.

When the fixture plate 26 is being pressed between the lower and upper heating plates 10 and 11, heating medium is supplied to the heaters 22 of the lower and upper heating plates 10 and 11 from the heating power source 16 via the wire or the hose 17A and heating medium is also supplied to the heaters 24 of the frame 12 via the wire or the hose 17B. As a result, the substrate blanks and the fixture plate 26 are heated uniformly at a predetermined temperature by the heaters 22 of the lower and upper heating plates 10 and 11 and also by the heaters 24 of the frame 12 while being pressed by the lower and upper heating plates 10 and 11 at a predetermined pressure.

When the substrate blanks and the fixture plate 26 are pressed and heated in the manner described above, the adhesives disposed between the ceramic substrates 26C are softened into a flowing state and thus the ceramic substrates 26C are bonded to each other under the pressure. In the above process, the frame 12 limits the expansion of the substrate blanks. Thus, it becomes possible to easily produce a high density ceramic substrate having a large number of layers with no sticking out of the substrate blanks.

After completion of bonding the ceramic substrates 26C by pressing and heating the substrate blanks and the fixture plate 26 for a predetermined period of time, supply 0f the heating medium is stopped and the cooling medium is supplied to the cooling medium paths 23 of the lower and upper heating plates 10 and 11 from the cooling source 18 via the cooling hose 19A and the cooling medium is also supplied to the cooling medium paths 25 of the frame 12 via the cooling hose 19B as shown in FIG. 1 so as to uniformly cool the bonded ceramic substrates and the fixture plate 26. Thus, the adhesives are hardened and the ceramic substrates have been formed into a complete product.

Now, the obtained product of the ceramic substrate is put out and it is cooled down to as low temperature as possible and then supply of the cooling medium is stopped. Then, the pressure oil in the hydraulic cylinder 3 is exhausted back to the hydraulic pressure source 20 via the hydraulic piping 21A and the pressure oil is supplied to the fixture-pushdown cylinders 14 via the hydraulic piping 21B. As a result, the main ram 4 is lowered due to its own weight, and accordingly the lower bolster 5, the heat insulating plate 9A, and the lower heating plate 10 are all lowered. On the other hand, the fixture-pushdown cylinders 14 urges the rams 15 in a downward direction and lowers the product of the ceramic substrate and the fixture plate 26 so as to remove them from the frame 12. Then, the main ram 4 is returned into the initial state as shown in FIG. 1. After removing the product of the ceramic substrate and the fixture plate 26 from the frame 12, the ram 15 of the fixture-pushdown cylinders 14 is returned to the predetermined position and then the product of the ceramic substrate and the fixture plate 26 are removed from the lower heating plate 10 by the loader or the like. Then, as the lower heating plate 10 is lowered the frame 12 is also lowered due to its own weight. As a result of lowering of the frame 12, the female tapered surfaces 12c of the pin holes 12b are fitted to the male tapered surfaces 13a of the positioning pins 13 and thus centering of the frame 12 is performed, as shown in FIG. 6.

By repeating the processing steps of pressing and heating the substrate blanks consisting of the ceramic substrates stacked one on another via an adhesive as described above, products are obtained one after another.

With respect to the operation of the above first embodiment, more detailed description will be given hereinbelow based on space specific values.

First, a open space is created between the lower and upper heating plates 10 and 11 as shown in FIG. 1, and then the fixture plate 26 with the substrate blanks consisting of a plurality of ceramic substrates 26C stacked one on another via an adhesives put on the upper surface of the lower heating plate 10 at its central portion.

Then, pressure oil is supplied to the hydraulic cylinder 3 from the hydraulic pressure source 20 via the hydraulic piping 21A so as to raise the lower bolster 5, the heat insulating plate 9A, the lower heating plate 10, and the fixture plate 26, via the main ram 4. During this raising process, the frame 12 is raised with its inside chamfers 12A guiding the outside chamfers 26A of the fixture plate 26. When the frame 12 has been raised until the gap $g_2$ between the frame 12 and the upper heating plate 11 becomes zero, the gaps $g_3$ between the pin holes 12b and the shanks of the positioning pins 13 begins to function such that the frame 12 moves following the outer sides of the fixture plate 26. Thus, the positioning error of the fixture plate 26 introduced by the loader and other errors are absorbed and the frame 12 is fitted to the fixture plate 26.

Thus, as described above, the hot press gets into the state as shown in FIG. 7 in which the fixture plate 26 is in contact with the upper heating plate 11. After the fixture plate 26 comes in contact with the upper heating plate 11, a preliminary surface pressure of 5–20 kgf/cm² is applied. At this time, a heating medium is supplied to the heaters 22 of the lower and upper heating plates 10 and 11 and to the heaters 24 of the frame 12 from heating power source 16 via the wires or heating hoses 17A and 17B so as to heat the lower and upper heating plates 10 and 11 and the frame 12 at a predetermined temperature. In this manner, not only the lower and upper heating plates 10 and 11 but also the frame 12 is heated. Thus, no difference occurs in temperature between the inside and the outside of the fixture plate 26. A preferable bonding temperature is in the range of 50° to 150° C. depending on the type of the adhesive used to bond the substrate blanks consisting of ceramic substrates 26C to each other.

When the adhesives disposed between the adjacent ceramic substrates 26C are softened until they reach a flowing state, the pressure of the pressure oil applied to the hydraulic cylinder 3 by the hydraulic pressure source 20 is raised up to a desired pressure in the range of 50 to 300 kgf/cm². The heating is carried out for a period of time in the range of three to thirty minutes.

After completion of the above bonding process, stabilization of the adhesive is performed at an adequate temperature, then supply of the heating medium from the heating power source 16 is stopped and a cooling medium is supplied to the cooling medium path 23 of the lower and upper heating plates 10 and 11 and to the cooling medium path 25 of the frame 12 from the cooling source 18 via the cooling hoses 19a and 19b so as to cool them down to a temperature at which the resulting product of the ceramic substrate can be taken out. After completion of cooling, supply of the cooling medium is stopped.

In the embodiment of FIGS. 1–7, if stainless steel (its thermal expansion coefficient=17.1*10E–6/° C.) is used as a material of the upper fixture plate 26A and the lower fixture plate 26B of the fixture plate 26, the material of the frame 12 is hard steel (its thermal expansion coefficient =10.7*10E–6/° C.), the outside dimension Li of the fixture plate 26 is 199.84 mm at room temperature (20° C.), the inside dimension Lo of the frame 12 is 200.00 mm, and the forming temperature tn is 130° C., then these values result in the bonding and forming conditions where the outside dimension of the fixture plate 26 is 200.216 mm, the inside dimension of the frame 12 is 200.176 mm, and the gap gn for each side is 0.02 mm. Furthermore, these conditions result in the gap $g_1$ of 0.16 mm at separation temperature $t_1$ (at room temperature or 20° C.). In this way, the gap $g_1$ becomes narrower when the bonding and forming are carried out, and sticking out of the substrate blanks are prevented, and furthermore the gap $g_1$ becomes wider at the separation temperature so as to easily separate the frame 12 from the fixture plate 26 after completion of forming, which all are achieved as a result of use of the difference in thermal expansion coefficient between the material of the frame 12 and the materials of the upper and lower fixture plates 26A and 26B of the fixture plate 26.

After the above cooling process, supply of the pressure oil to the hydraulic cylinder 3 is stopped so as to lower the main ram 4 by its own weight. On the other hand, the pressure oil is supplied to the fixture-pushdown cylinders 14 from the hydraulic pressure source 20 via the hydraulic piping 21B so as to separate the fixture plate 26 from the frame 12 via the ram 15. Thus, the fixture plate 26 is put on the upper surface of the lower heating plate 10 and then the ram 15 of the fixture-pushdown cylinders 14 is returned to the starting position, while the lower bolster 5, the heat insulating plate 9A, the lower heating plate 10, the fixture plate 26, and the resultant product of the ceramic substrate are all lowered together with the main ram 4 to their starting positions.

Figure 8:
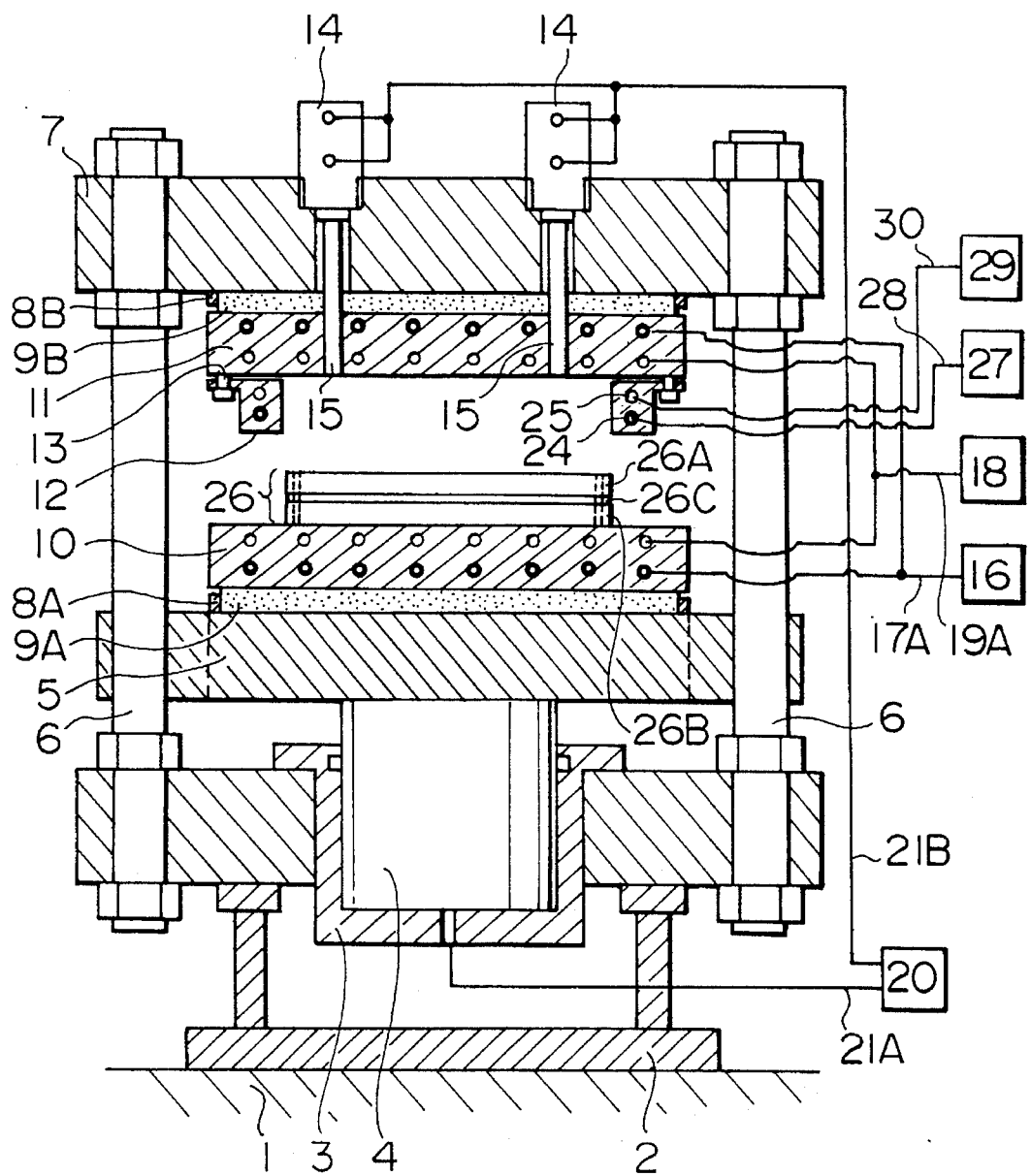
FIG. 8 is a longitudinal sectional view of a hot press in accordance with another embodiment of the present invention.

In the embodiment of FIG. 8, heaters 24 of a frame 12 are supplied with electric or another type of thermal medium via a heating hose 28 from a heating power source 27 which is independent of a heating power source 16. On the other hand, a cooling medium path 25 of the frame 12 is supplied with a cooling medium via a cooling hose 30 from a cooling source 29 which is independent of a cooling source 18.

When a fixture plate 26 is fit in the frame 12, the frame 12 comes in contact with the outside of substrate blanks and the fixture plate 26, which possibly result in disturbance of the forming temperature of the substrate. In the embodiment of FIG. 8, the temperature of the frame 12 is controlled by a different temperature control system from that for the lower and upper heating plates 10 and 11 so as to prevent the substrate forming temperature from being disturbed by contacting of the frame 12 with the outside of the substrate blanks and the fixture plate 26 and thus so as to achieve more uniform heating of the substrate material and the fixture plate 26. Furthermore, the temperature control system for heating and cooling the frame 12 is separated from that for heating and cooling the lower and upper heating plates 10 and 11. As a result of this, it becomes possible to perform initial fitting by heating only the frame 12 and also to separate the fixture plate 26 and the resultant product of the ceramic substrate from the frame 12 by cooling the frame 12 independently of other portions. Thus, it becomes possible to achieve easier and more reliable processes for initial fitting and for separation.

Other configurations and operation of the embodiment of FIG. 8 are the same as those of the embodiment of FIGS 1–7.

Figure 9:
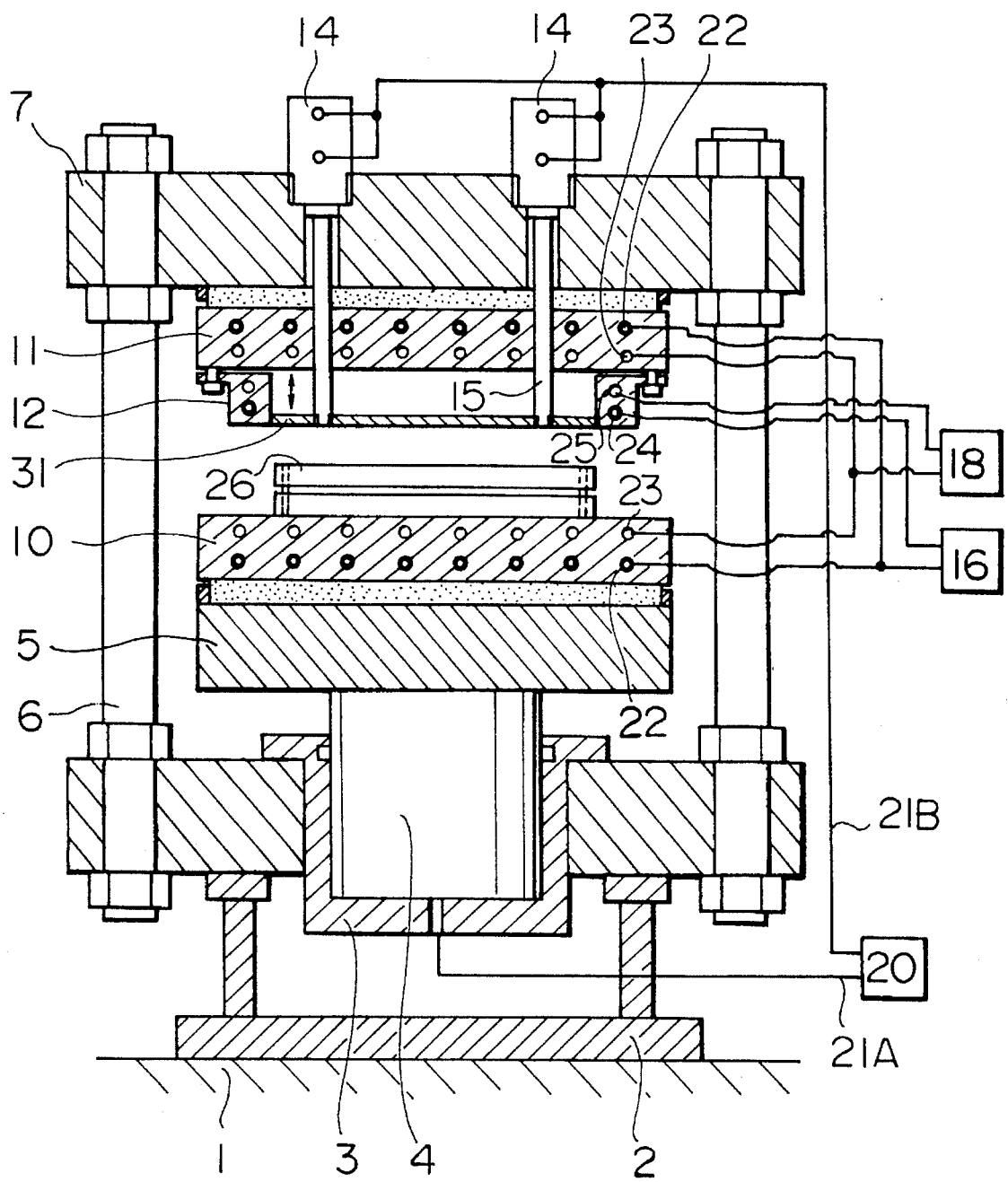
FIG. 9 is a longitudinal sectional view of a hot press in accordance still another embodiment of the present invention.

In the embodiment of FIG. 9, there is provided a cleaning plate 31 in the inside of a frame 12 with the cleaning plate 31 being made of a material having a thermal expansion coefficient which is the same as or similar to that of the frame 12 wherein the cleaning plate 31 is formed with a material having a good thermal conductivity such that it has dimensions slightly smaller that the inside dimensions of the frame 12 so as to achieve good thermal conduction from the upper heating plate 11 to the fixture plate 26. The Cleaning plate 31 is attached to the bottom of a ram 15 fitted in a fixture-pushdown cylinders 14 through an upper bolster 7 and a heat insulating plate 9B.

When bonding and forming are carried out, the cleaning plate 31 transmits the applied pressure from the upper bolster 7 to the fixture plate 26, and also transmits the heat from the upper heating plate 11 to the fixture plate 26. Thus, the fixture plate 26 is heated and applied with pressure via the cleaning plate 31.

When a main ram 4, a lower bolster 5, and a heat insulating plate 9A are all lowered after the completion of bonding and forming processes, the cleaning plate 31 lowers the fixture plate 26 and the resultant product of the ceramic substrate so as to separate them from the frame 12, with the ram 15 being stuck out downward by the fixture-pushdown cylinders 14. On the other hand, when cleaning is carried out, the cleaning plate 31 is slid up and down by the ram 15 and fixture-pushdown cylinders 14 so as to remove the remaining adhesive on the inner surface of the frame 12. As a result of this cleaning, it becomes unnecessary for an operator to do difficult cleaning by putting a part of his/her body being in the narrow space between the lower and upper heating plates 10 and 11 so as to remove the remaining adhesive on the inner surface of the frame 12. Furthermore, it becomes possible to prevent an accident during cleaning in which an operator is pressed by the lower bolster 5 raised by someone who was not aware that the operator was in a cleaning operation.

As can be seen from the above description, in The embodiment of FIG. 9, the ram 15 and the fixture-pushdown cylinders 14 also function as an operating means for sliding the cleaning plate 31 forward and backward inside the frame 12.

In an alternative form of the embodiment of FIG. 9, the frame 12 and the cleaning plate 31 may be disposed on the lower heating plate 10 and the cleaning plate 31 may be raised up to or above the upper surface of the frame 12 so as to load substrate blanks then the cleaning plate 31 may be lowered and the substrate blanks may be positioned in adequate place with respect to the frame 12 and then the substrate blanks may be pressed and heated.

In each embodiment of the present invention, it may also be configured that the lower bolster 5 is fixed and the upper bolster 7 is movable.

As described above, with the present invention, it is possible to achieve easy and reliable processes for producing a ceramic substrate or a printed circuit board having high density and a large number of layers with no occurrence of sticking lout of the substrate blanks due to the fact that the frame limits the expansion of the substrate blanks when the substrate blanks are pressed and heated by both sides of the upper and lower heating plates wherein the substrate blanks are fitted to one of these upper and lower heating plates during the pressing and heating process.

In the present invention, the frame is made of a material having a thermal expansion coefficient which is less than those of the substrate blanks and the fixture plate which is put together with the stacked substrate blanks between the upper and lower heating plates. Thus, the difference in thermal expansion coefficient between the material of the frame and the materials of the fixture plate leads to the effect that the fixture plate and the resultant product of the ceramic substrate can be removed from the frame. Furthermore, because the frame is controlled by a temperature control system which is different from the temperature control system for the upper and lower heating plates, it is possible to prevent the forming temperature of the substrate from being disturbed by contacting of the frame with the outside of the substrate blanks and the fixture plate. Thus, it becomes possible to achieve more uniform heating of the substrate materials, and also it becomes possible to achieve easier and more reliable initial, fitting and final separation of the fixture plate and the resultant product of the ceramic substrate from the frame.

In the present invention, the cleaning plate is provided inside the frame wherein the cleaning plate has the outside dimensions slightly larger than the inside dimensions of the frame, and furthermore the cleaning plate is fixed to the operating means for sliding this cleaning plate within the frame. As a result of use of this cleaning plate, it becomes possible to achieve more uniform pressing and heating of the fixture plate, and it also becomes secured to remove the fixture plate from the frame. Furthermore, it becomes possible to remove the remaining adhesive on the inner surface of the frame.

We claim:

1. A hot press for producing a multilayered substrate, comprising:

upper and lower bolsters disposed opposite to each other in a vertical direction and movable relative to and toward each other to press multilayered substrate blanks therebetween;

a main ram for imparting relative movement between said upper and lower bolsters to produce a press force;

upper and lower heating and cooling plates which are provided on the opposed surfaces of said upper and lower bolsters through heat insulating plates, respectively;

a frame provided on either one of the upper and lower heating and cooling plates, the multilayered substrate blanks being fitted into said frame, said frame being arranged such that said frame limits expansion of the multilayered substrate blanks when the multilayered substrate blanks are pressed and heated by the upper and lower heating and cooling plates;

heating and cooling means for heating and cooling said upper and lower heating and cooling plates and said frame during bonding of said multilayered substrate blanks and four cooling said plates and said frame after the bonding; and a forward-and-backward moving means provided on one of said bolsters on which said frame is provided, said forward-and-backward moving means moving forward and backward through the heat insulating plate and the heating plate which are provided successively on said one of bolsters.

2. A hot press according to claim 1, wherein a cleaning plate is further provided inside said frame, said cleaning plate having outside dimensions slightly smaller than the inside dimensions of said frame, said cleaning plate being slid by said forward-and-backward moving means.

3. A hot press for producing a multilayered substrate, comprising:

Upper and lower bolsters disposed opposite to each other in a vertical direction and movable relative to and toward each other to press multilayered substrate blanks therebetween;

a main ram for imparting relative movement between said upper and lower bolsters to produce a pressing force;

upper and lower heating and cooling plates which are provided on the opposed surfaces of said upper and lower bolsters through heat insulating plates, respectively;

a frame provided on either one of the upper and lower heating and cooling plates, the multilayered substrate blanks being fitted into said frame, said frame being arranged such that said frame limits expansion of the multilayered substrate blanks when the multilayered substrate blanks are pressed and heated by the upper and lower heating and cooling plates;

heating and cooling means for heating and cooling said upper and lower heating and cooling plates and said frame during bonding of said multilayered substrate blanks and for cooling said plates and said frame after the bonding; and a pair of fixture plates including upper and lower fixture plates between which said multilayered substrate blanks are provided, the pair of fixture plates being arranged to be fit within said frame, wherein said frame has a thermal expansion coefficient less than that of said pair of fixture plates.

4. A hot press for producing a multilayered substrate, comprising:

upper and lower bolsters disposed opposite to each other in a vertical direction and movable relative to and toward each other to press multilayered substrates blanks therebetween;

a main ram for imparting relative movement between said upper and lower bolsters to produce a pressing force;

upper and lower heating and Cooling plates which are provided on the opposed surface of said upper and lower bolsters through heat insulating plates, respectively;

a frame provided on either one of the upper and lower heating and cooling plates, the multilayered substrate blanks being fitted into said frame, said frame being arranged such that said frame limits expansion of the multilayered substrate blanks when the multilayered substrate blanks are pressed and heated by the upper and lower heating and cooling plates;

first heating and cooling means for heating and cooling said upper and lower heating and cooling plates during bonding of said multilayered substrate blanks and for cooling said plates after the bonding; and second heating and cooling means for heating and cooling said frame during bonding of said multilayered substrate blanks and for cooling said frame after the bonding, said second heating and cooling means being independent from said first heating and cooling means.

* * * * *